(12) United States Patent
Sameshima

(10) Patent No.: US 9,941,231 B2
(45) Date of Patent: Apr. 10, 2018

(54) SEMICONDUCTOR DEVICE

(71) Applicant: ROHM CO., LTD., Kyoto (JP)

(72) Inventor: Katsumi Sameshima, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 15/451,770

(22) Filed: Mar. 7, 2017

(65) Prior Publication Data

US 2017/0179060 A1    Jun. 22, 2017

Related U.S. Application Data

(63) Continuation of application No. 15/236,016, filed on Aug. 12, 2016, now Pat. No. 9,607,957, which is a continuation of application No. 14/690,982, filed on Apr. 20, 2015, now Pat. No. 9,437,544, which is a
(Continued)

(30) Foreign Application Priority Data

Nov. 16, 2007    (JP) ................................ 2007-298361

(51) Int. Cl.
*H01L 23/48*    (2006.01)
*H01L 23/00*    (2006.01)

(52) U.S. Cl.
CPC .............. *H01L 24/13* (2013.01); *H01L 24/08* (2013.01); *H01L 24/14* (2013.01); *H01L 2224/0401* (2013.01); *H01L 2224/05582* (2013.01); *H01L 2224/05647* (2013.01); *H01L 2224/05666* (2013.01); *H01L 2224/05684* (2013.01)

(58) Field of Classification Search
CPC ......... H01L 24/13; H01L 24/08; H01L 24/14; H01L 2224/0401; H01L 2224/05582; H01L 2224/05647; H01L 2224/05666; H01L 2224/05684
See application file for complete search history.

(56) References Cited

U.S. PATENT DOCUMENTS

| 5,508,561 A | 4/1996 | Tago et al. |
| 5,731,219 A | 3/1998 | Ikeda et al. |
| 6,111,317 A | 8/2000 | Okada et al. |

(Continued)

FOREIGN PATENT DOCUMENTS

| JP | 54-111761 | 9/1979 |
| JP | 01-278751 | 11/1989 |

(Continued)

*Primary Examiner* — Yosef Gebreyesus
(74) *Attorney, Agent, or Firm* — Rabin & Berdo, P.C.

(57) ABSTRACT

A semiconductor chip includes a substrate, an electrode pad formed on the substrate, an insulating layer covering the substrate and the electrode pad, and having an opening exposing a portion of a surface of the electrode pad, a first conductive layer formed on the exposed portion of the surface of the electrode pad and extending to a surface of the insulating layer, and a second conductive layer formed on the first conductive layer, covering the first conductive layer in a plan view, and having an outer edge portion which is located further out than an outer edge of the first conductive layer in a plan view. The outer edge portion of the second conductive layer has at least one curved portion. At least one portion of the curved portion is located between the outer edge of the first conductive layer and an outer edge of the second conductive layer in a plan view.

18 Claims, 4 Drawing Sheets

Related U.S. Application Data continuation of application No. 12/272,001, filed on Nov. 17, 2008, now Pat. No. 9,035,455.

(56) References Cited

U.S. PATENT DOCUMENTS

| | | | |
|---|---|---|---|
| 6,133,136 | A | 10/2000 | Edelstein et al. |
| 6,293,457 | B1 | 9/2001 | Srivastava et al. |
| 6,323,542 | B1 | 11/2001 | Hashimoto |
| 6,335,568 | B1 | 1/2002 | Yuzawa et al. |
| 6,362,087 | B1 | 3/2002 | Wang et al. |
| 6,426,556 | B1 | 7/2002 | Lin |
| 6,436,300 | B2 | 8/2002 | Woolsey et al. |
| 6,479,900 | B1 | 11/2002 | Shinogi et al. |
| 6,864,168 | B2 | 3/2005 | Chen et al. |
| 6,927,489 | B1 | 8/2005 | Yaguchi et al. |
| 7,064,436 | B2 | 6/2006 | Ishiguri et al. |
| 7,227,262 | B2 | 6/2007 | Tanida et al. |
| 7,235,881 | B2 | 6/2007 | Hashimoto |
| 7,456,502 | B2 | 11/2008 | Tanida et al. |
| 7,663,201 | B2 | 2/2010 | Yamada |
| 7,947,978 | B2 | 5/2011 | Lin et al. |
| 7,985,671 | B2 | 7/2011 | Daubenspeck et al. |
| 7,989,356 | B2 | 8/2011 | Bao et al. |
| 8,643,150 | B1 | 2/2014 | Xu et al. |
| 8,669,137 | B2 | 3/2014 | Nah et al. |
| 9,087,701 | B2 | 7/2015 | Park et al. |
| 9,607,957 | B2 * | 3/2017 | Sameshima ............. H01L 24/08 |
| 2002/0072215 | A1 | 6/2002 | Furuya |
| 2004/0000710 | A1 * | 1/2004 | Oya ........................ H01L 23/13 257/700 |
| 2004/0113272 | A1 | 6/2004 | Chen et al. |
| 2004/0222522 | A1 | 11/2004 | Homma |
| 2005/0092611 | A1 | 5/2005 | Kim et al. |
| 2005/0140004 | A1 | 6/2005 | Ishiguri et al. |
| 2005/0151250 | A1 * | 7/2005 | Chiba ................. H01L 21/2885 257/738 |
| 2005/0199995 | A1 | 9/2005 | Nomoto et al. |
| 2006/0030139 | A1 | 2/2006 | Mis et al. |
| 2006/0214296 | A1 | 9/2006 | Okamoto et al. |
| 2006/0246706 | A1 | 11/2006 | Ke et al. |
| 2006/0258045 | A1 | 11/2006 | Ishiguri et al. |
| 2006/0292711 | A1 | 12/2006 | Su et al. |
| 2007/0246133 | A1 | 10/2007 | Helneder et al. |
| 2007/0290343 | A1 | 12/2007 | Harada et al. |
| 2008/0036086 | A1 | 2/2008 | Ishio |

FOREIGN PATENT DOCUMENTS

| | | |
|---|---|---|
| JP | 09-139387 | 5/1997 |
| JP | 09-199505 | 7/1997 |
| JP | 2004-071872 A | 3/2004 |
| JP | 2004-152953 A | 5/2004 |
| JP | 2005-085857 A | 3/2005 |
| JP | 2005-166959 A | 6/2005 |
| JP | 2005-175128 A | 6/2005 |
| JP | 2005-353897 A | 12/2005 |
| JP | 2006-278551 A | 10/2006 |

* cited by examiner

SEMICONDUCTOR DEVICE

CROSS-REFERENCE TO RELATED APPLICATION

This application is a continuation of co-pending application Ser. No. 15/236,016, filed on Aug. 12, 2016, which is a continuation of application Ser. No. 14/690,982, filed on Apr. 20, 2015 (now U.S. Pat. No. 9,437,544, issued on Sep. 6, 2016), which is a continuation of application Ser. No. 12/272,001, filed on Nov. 17, 2008 (now U.S. Pat. No. 9,035,455 issued on May 19, 2015). Furthermore, this application claims the benefit of priority of Japanese application 2007-298361, filed on Nov. 16, 2007. The disclosures of these prior U.S. and Japanese applications are incorporated herein by reference.

BACKGROUND OF THE INVENTION

Field of the Invention

The present invention relates to a semiconductor device applying a so-called WL-CSP (Wafer Level-Chip Size Package) technology.

Description of Related Art

With the recent making of semiconductor devices more advanced in function and multifunctional, practical use of WL-CSP technology is progressing. With a WL-CSP technology, a packaging process is completed in a wafer state, and a size of each individual chip cut out by dicing becomes a package size.

FIG. 4 is a schematic sectional view of a structure of a semiconductor device to which a WL-CSP technology is applied.

The semiconductor device 101 includes a semiconductor chip (not shown) making up a base thereof. An interlayer insulating film 102 made of SiO$_2$ (silicon dioxide) is formed on the semiconductor chip. A wiring 103 made of Al (aluminum) is formed in a predetermined wiring pattern on the interlayer insulating film 102. A passivation film 104 made of SiN (silicon nitride) is formed on the interlayer insulating film 102 and the wiring 103. An opening 105 for exposing a portion of the wiring 103 from the passivation film 104 is formed in the passivation film 104.

A barrier film 106 made of Ti (titanium) is formed on a portion of the wiring 103 facing the opening 105. A peripheral edge portion of the barrier film 106 rides on the passivation film 104. A post bump 107 made of Cu (copper) is formed on the barrier film 106. A side surface of the post bump 107 is flush with a side surface of the barrier film 106. A solder ball 108 is formed on the post bump 107. The solder ball 108 is an external terminal connected to an external wiring on a wiring substrate. By the solder ball 108 being connected to the external wiring on the wiring substrate, electrical connection of the wiring 103 and the external wiring is achieved and the semiconductor device 101 is supported on the wiring substrate.

With such a structure, when an external force is applied to the solder ball 108, stress concentrates at the peripheral edge portion of the barrier film 106 and the post bump 107. By the concentration of stress, a crack may form in the passivation film 104 positioned immediately below the peripheral edge portion of the barrier film 106.

To prevent crack formation in the passivation film 104, forming of a polyimide layer having a penetrating hole in communication with the opening 105 on the passivation film 104 and positioning of the peripheral edge portion of the barrier film 106 on the polyimide layer may be considered.

Because the polyimide layer is interposed between the peripheral edge portion of the barrier film 106 and the passivation film 104, even when stress concentrates at the peripheral edge portions of the barrier film 106 and the post bump 107, the stress is absorbed by the polyimide layer and is not transmitted to the passivation film 104. Crack formation in the passivation film 104 can thus be prevented.

However, because a step of forming the polyimide layer must be added, a number of manufacturing steps of the semiconductor device 101 is increased and this causes increase in manufacturing cost. Also, the polyimide layer must be formed to an adequate thickness capable of absorbing the stress. Thus, there is an issue of increase in thickness of the semiconductor device 101.

SUMMARY OF THE INVENTION

An object of the present invention is to provide a semiconductor device with which crack formation in a passivation film can be prevented without causing increase in number of manufacturing steps, increase in thickness and other problems.

A semiconductor device according to one aspect of the present invention includes: a semiconductor chip; a wiring formed on the semiconductor chip; a passivation film, coating the wiring and having an opening for partially exposing the wiring from the passivation film; an interposing film, formed on a portion of the wiring facing the opening; and a post bump, raisedly formed on the interposing film and with a peripheral edge portion thereof protruding more toward a side than a peripheral edge of the interposing film.

With this configuration, the wiring is formed on the semiconductor chip. The wiring is coated with the passivation film. The opening for partially exposing the wiring from the passivation film is formed in the passivation film. The interposing film is formed on the portion of the wiring facing the opening. The protuberant post bump, with its peripheral edge portion protruding more toward the side than the peripheral edge portion of the interposing film, is formed on the interposing film.

By the peripheral edge portion of the post bump protruding away from the opening for partially exposing the wiring more than the peripheral edge of the interposing film in a direction parallel to a surface of the passivation film, a space is formed between the peripheral edge portion of the post bump and the passivation film. By this space being present, the peripheral edge portion of the post bump is deformable in a direction of opposing the passivation film. Thus, even if a stress arises in the post bump, the stress can be absorbed by deformation of the peripheral edge portion of the post bump. Consequently, crack formation in the passivation film can be prevented.

Further, because a polyimide layer for stress relaxation is not interposed between the passivation film and the post bump, problems due to providing a polyimide layer, such as increase in number of manufacturing steps, increase in thickness of the semiconductor device, etc., do not occur.

Preferably, a protrusion amount of the peripheral edge portion of the post bump with respect to the peripheral edge of the interposing film is greater than a thickness of the interposing film. By the protrusion amount of the peripheral edge portion of the post bump thus being greater than the thickness of the interposing film, a width of the deformable peripheral edge portion of the post bump can be secured to be greater than the thickness of the interposing film.

To make the protrusion amount of the peripheral edge portion of the post bump greater than the film thickness of the interposing film, for example, a layer made of a material of the interposing film is formed on the passivation film and on the wiring, and after forming the post bump on this layer, in a step of patterning the layer made of the material of the interposing film by wet etching, an etching time is set so that etching progresses to below the post bump.

Further, a peripheral edge portion of the interposing film may be formed to ride on a circumference of the opening in the passivation film.

The foregoing and other objects, features, and effects of the present invention will become more apparent from the following detailed description of the embodiments with reference to the attached drawings.

DETAILED DESCRIPTION OF PREFERRED EMBODIMENTS

An embodiment of the present invention shall now be described in detail with reference to the attached drawings.

Figure 1:
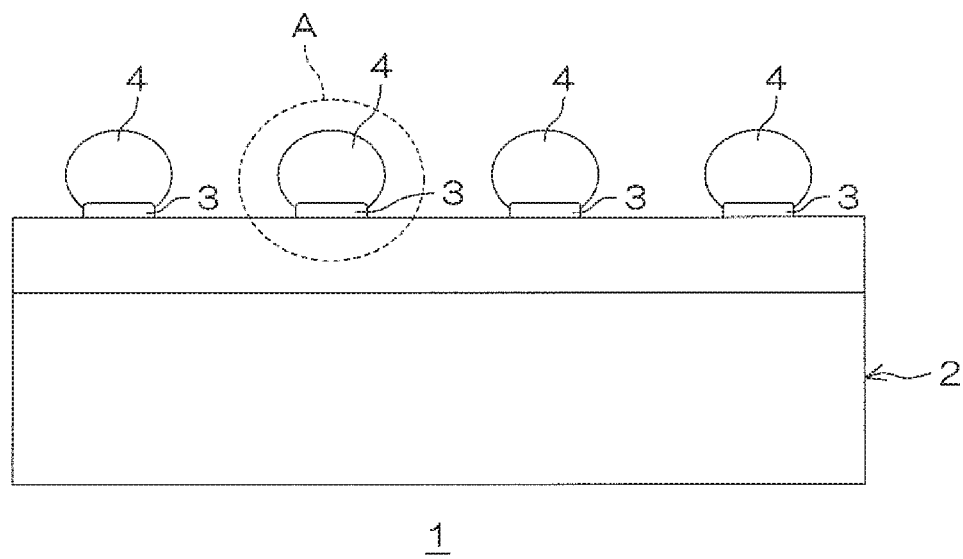
FIG. 1 is a side view of an outer appearance of a semiconductor device according to an embodiment of the present invention.

FIG. 1 is a side view of an outer appearance of a semiconductor device according to a first embodiment of the present invention.

A WL-CSP technology is applied in the semiconductor device 1. The semiconductor device 1 includes a semiconductor chip 2, a plurality of post bumps 3 disposed on the semiconductor chip 2, and solder balls 4 bonded to the respective post bumps 3.

Figure 2:
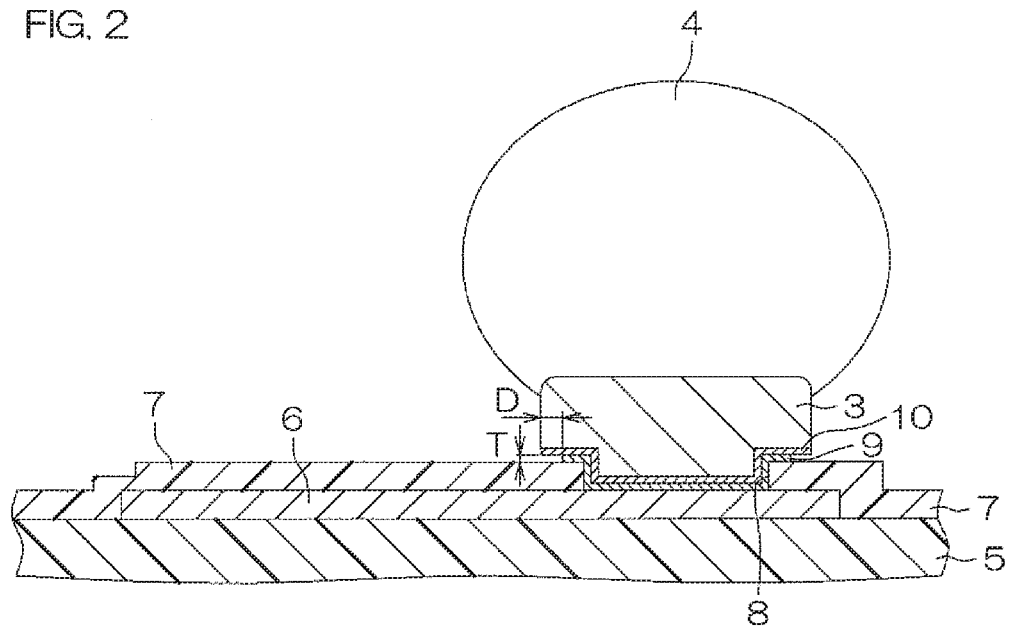
FIG. 2 is a schematic sectional view of a structure of a portion of the semiconductor device shown in FIG. 1.

FIG. 2 is a schematic sectional view of a structure of a portion surrounded by a broken line A in FIG. 1.

An interlayer insulating film 5 made of $SiO_2$ is formed on a top layer portion of the semiconductor chip 2. A wiring 6 made of Al is formed in a predetermined pattern on the interlayer insulating film 5.

A passivation film 7 made of SiN is formed on the interlayer insulating film 5 and the wiring 6. The wiring 6 is covered by the passivation film 7. An opening 8 for exposing a portion of the wiring 6 from the passivation film 7 is formed in the passivation film 7.

A barrier film 9 made of TiW (titanium tungsten) is coated on a portion of the wiring 6 facing the opening 8. The barrier film 9 has a predetermined thickness T (for example of 180 nm). The barrier film 9 covers a top surface of the wiring 6 and a side surface of the passivation film 7 inside the opening 8 and a peripheral edge portion thereof rides on a top surface of the passivation film 7.

A seed film 10 made of Cu is formed on the barrier film 9. A peripheral edge portion of the seed film 10 protrudes to a side with respect to a peripheral edge of the barrier film 9 by a protrusion amount D greater than the film thickness T of the barrier film 9.

The post bump 3 is protuberantly formed on the seed film 10. The post bump 3 is made, for example, of Cu. A side surface of the post bump 3 is substantially flush with a side surface of the seed film 10.

By a peripheral edge portion of the post bump 3 protruding more to the side than the peripheral edge of the barrier film 9, a space is formed between the peripheral edge portion of the post bump 3 and the passivation film 7. By the presence of this space, the peripheral edge portion of the post bump 3 is deformable in a direction of opposing the passivation film 7. Thus, even if a stress arises in the post bump 3, the stress can be absorbed by deformation of the peripheral edge portion of the post bump 3. Consequently, crack formation in the passivation film 7 can be prevented.

Also, because a polyimide layer for stress relaxation is not interposed between the passivation film 7 and the post bump 3, problems due to providing a polyimide layer, such as increase in number of manufacturing steps of the semiconductor device 1, increase in thickness of the semiconductor device 1, etc., do not occur.

The protrusion amount D of the peripheral edge portion of the post bump 3 is greater than the thickness T of the barrier film 9. A width of the deformable peripheral edge portion in the post bump 3 can thereby be secured to be greater than the thickness of the barrier film 9.

FIGS. 3A to 3E are schematic sectional views illustrating, in order of process, a method for manufacturing the semiconductor device shown in FIG. 2.

Figure 3A:
FIG. 3A is a schematic sectional view for describing a method for manufacturing the semiconductor device shown in FIG. 2.

First, as shown in FIG. 3A, the interlayer insulating film 5 is formed by a CVD (Chemical Vapor Deposition) method. Thereafter, by a sputter method, a metal film made of Al (not shown) is formed on the entire surface of the interlayer insulating film 5. Then, the metal film on the interlayer insulating film 5 is removed selectively by photolithography and etching. The wiring 6 having the predetermined pattern is thereby formed on the interlayer insulating film 5.

Figure 3B:
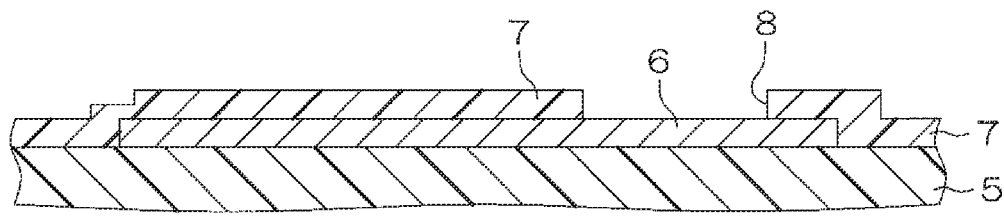
FIG. 3B is a schematic sectional view of a step subsequent to that of FIG. 3A.

Then, as shown in FIG. 3B, the passivation film 7 is formed on the interlayer insulating film 5 and the wiring 6 by the CVD method. Thereafter, a resist pattern (not shown) is formed on the passivation film 7. Then, the passivation film 7 is etched using the resist pattern as a mask. The opening 8 exposing a portion of the wiring 6 from the passivation film 7 is thereby formed in the passivation film 7. After the opening 8 is formed, the resist pattern is removed.

Figure 3C:
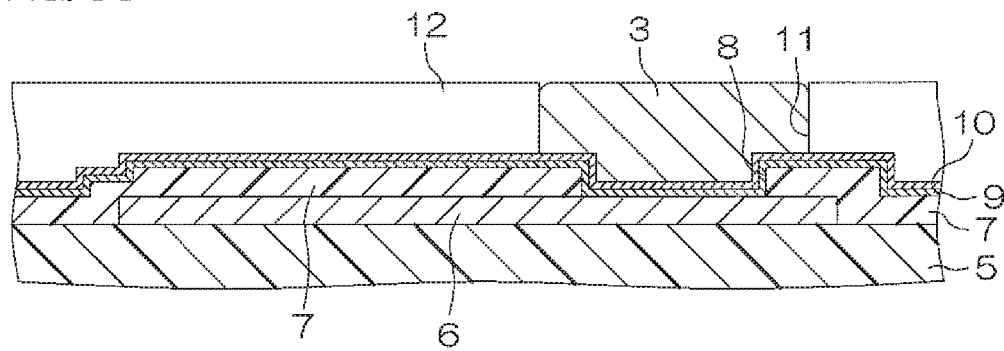
FIG. 3C is a schematic sectional view of a step subsequent to that of FIG. 3B.

Thereafter, as shown in FIG. 3C, the barrier film 9 made of TiW is formed on the portion of the wiring 6 facing the opening 8 and on the passivation film 7 by the sputter method. Then, the seed film 10 made of Cu is formed on the barrier film 9 by the sputter method. Then, a resist film 12 having an opening 11 at a portion at which the post bump 3 is to be formed is formed on the seed film 10. Thereafter, Cu is deposited inside the opening 11 of the resist film 12 by a plating method and the post bump 3 is thereby formed. After the post bump 3 is formed, the resist film 12 is removed.

Figure 3D:
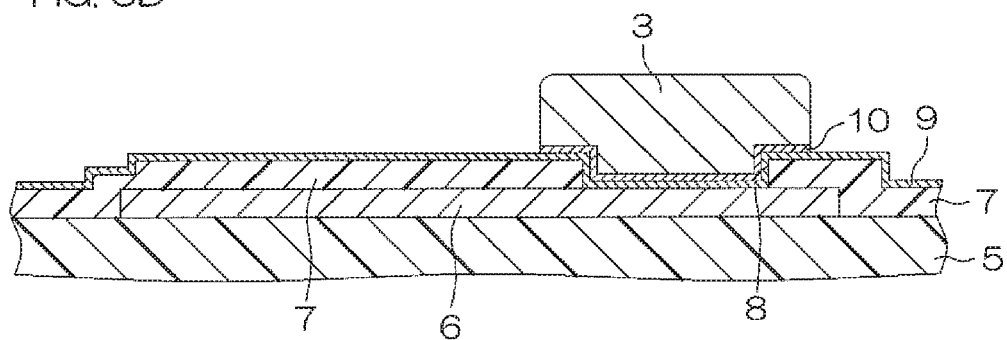
FIG. 3D is a schematic sectional view of a step subsequent to that of FIG. 3C.

Then, as shown in FIG. 3D, a portion of the seed film 10 exposed from the post bump 3 is removed by wet etching. That is, a liquid capable of etching the seed film 10 is supplied to the seed film 10 and the seed film 10 is removed with the exception of a portion in contact with the post bump 3. Thus, the seed film 10 having the side surface substantially flush with the side surface of the post bump 3 remains between the post bump 3 and the barrier film 9.

Figure 3E:
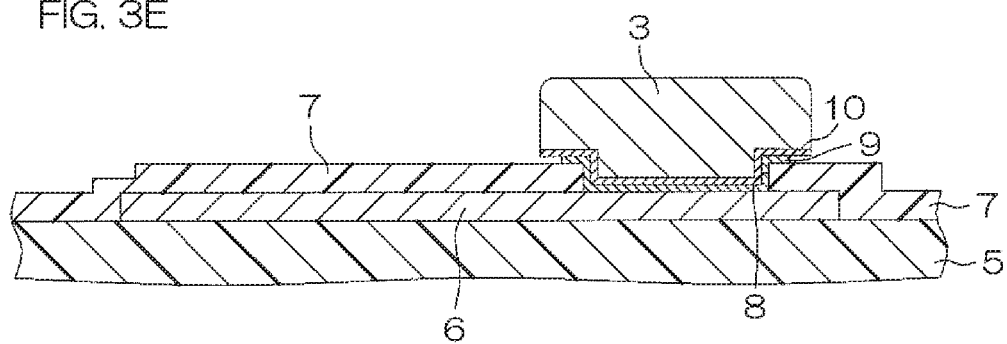
FIG. 3E is a schematic sectional view of a step subsequent to that of FIG. 3D.
Figure 4:
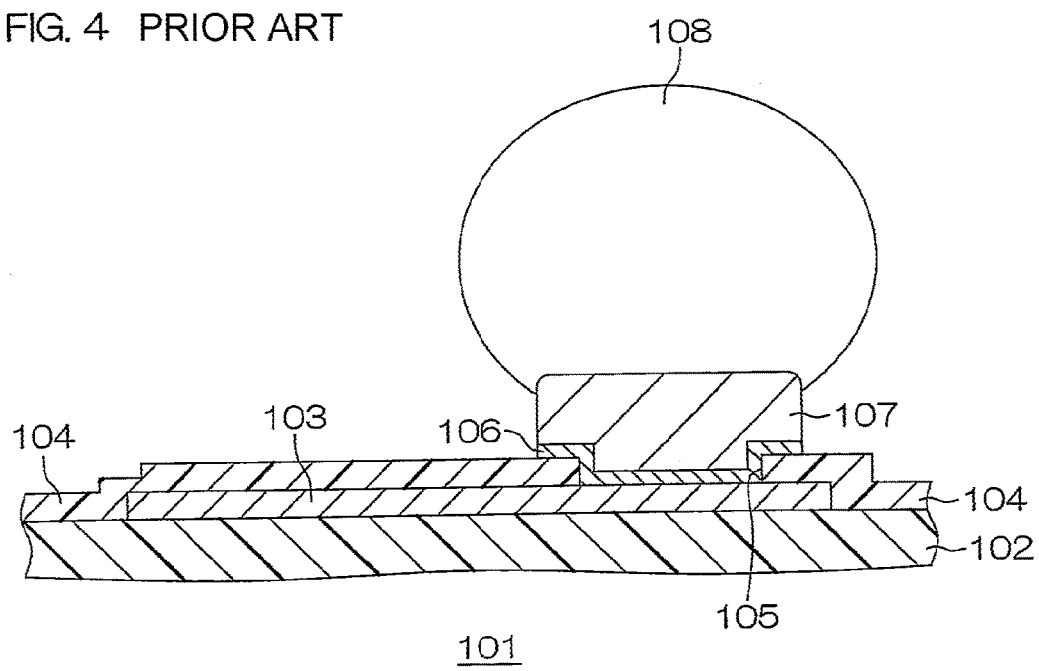
FIG. 4 is a schematic sectional view of a structure of a conventional semiconductor device.

Thereafter, a liquid capable of etching the barrier film 9 is supplied to the barrier film 9. In this process, an etching liquid supplying time is set so that the etching progresses to the barrier film 9 below the seed film 10. A portion of the barrier film 9 exposed from the seed film 10 and a portion of the barrier film 9 sandwiched between the peripheral edge portion of the seed film 10 and the passivation film 7 are thereby removed as shown in FIG. 3E. Consequently, the side surface of the barrier film 9 is positioned more to an inner side (the opening 8 side) than the side surface of the seed film 10, and the post bump 3 and the seed film 10 take on shapes with the peripheral edge portions protruding to the side with respect to the peripheral edge of the barrier film 9.

By thus setting the etching time in the process of patterning the layer made of the material of the barrier film 9 so that the etching progresses below the post bump 3, the protrusion amount D of the peripheral edge portion of the post bump 3 can be made greater than the thickness T of the barrier film 9. A space can thereby be formed between the peripheral edge portion of the seed film 10 and the passivation film 7 without causing increase in the number of manufacturing steps.

Various modifications may be applied to the present embodiment.

For example, the material of the barrier film 9 may be any material having a barrier property with respect to Cu. Ti (titanium), Ta (tantalum), and TaN (tantalum nitride) can be cited as examples of such a material.

Further, Au (gold) may be used as the material of the post bump 3. When Au is employed as the material of the post bump 3, TiW can be used as the material of the barrier film 9.

The wiring 6 may be formed using a metal material containing Cu. AlCu (aluminum/copper alloy) and Cu can be cited as examples of a metal material containing Cu. In this case, a wiring groove may be formed by digging in from an upper surface of the interlayer insulating film 5 and the wiring 6 may be embedded in this wiring groove.

While the present invention has been described in detail by way of the embodiments thereof, it should be understood that these embodiments are merely illustrative of the technical principles of the present invention but not limitative of the invention. The spirit and scope of the present invention are to be limited only by the appended claims.

What is claimed is:

1. A semiconductor chip, comprising:
    a substrate;
    an electrode pad formed on the substrate;
    an insulating layer covering the substrate and the electrode pad, and having an opening exposing a portion of a surface of the electrode pad therethrough;
    a first conductive layer formed on the exposed portion of the surface of the electrode pad and extending to a surface of the insulating layer;
    a second conductive layer formed on the first conductive layer, covering the first conductive layer when viewed in plan, and having an outer edge portion which is located further out than an outer edge of the first conductive layer when viewed in plan, the second conductive layer including a conductive film covering the first conductive layer and a post bump formed on the conductive film and having a side face, the post bump having a thickness greater than a sum of thicknesses of the first conductive layer and the conductive film; and
    a bump electrode formed on the second conductive layer and covering an upper portion of the side face of the post bump,
    wherein the outer edge portion of the second conductive layer has at least one curved portion, and
    at least one portion of the curved portion is located between the outer edge of the first conductive layer and an outer edge of the second conductive layer when viewed in plan.

2. The semiconductor chip according to claim 1, wherein the bump electrode covers the curved portion.

3. The semiconductor chip according to claim 1, wherein at least one portion of the curved portion is located in the bump electrode.

4. The semiconductor chip according to claim 1, wherein a surface of the substrate is separated from a surface of the second conductive layer by a first distance that is longer than a second distance separating the surface of the substrate from a surface of the first conductive layer.

5. The semiconductor chip according to claim 1, wherein the curved portion is formed at a surface of the second conductive layer.

6. The semiconductor chip according to claim 1, wherein the first conductive layer is a film made of Ti and W.

7. The semiconductor chip according to claim 1, wherein the second conductive layer includes a Cu layer.

8. The semiconductor chip according to claim 1, wherein the second conductive layer includes a Cu layer of uniform thickness plated on the first conductive layer.

9. The semiconductor chip according to claim 1, wherein the outer edge portion of the second conductive layer protrudes with respect to the outer edge of the first conductive layer by a distance greater than a thickness of the first conductive layer.

10. The semiconductor chip according to claim 1, wherein the curved portion forms arcs on both sides of a surface of the second conductive layer in a cross section taken perpendicularly to the surface of the second conductive layer.

11. The semiconductor chip according to claim 1, wherein an outer edge portion of the first conductive layer is formed directly on the insulating layer at a periphery of the opening.

12. The semiconductor chip according to claim 1, wherein the first conductive layer and the second conductive layer are both disposed over an entire surface of the opening.

13. The semiconductor chip according to claim 1, wherein the first conductive layer is disposed over an entire surface of the opening.

14. The semiconductor chip according to claim 1, wherein the surface of the insulating layer is separated from the outer edge portion of the second conductive layer by a gap.

15. The semiconductor chip according to claim 1, wherein the first conductive layer has a thickness of about 180 nm.

16. The semiconductor chip according to claim 1, wherein the bump electrode partly covers the second conductive layer such that a portion of the second conductive layer is exposed from the bump electrode.

17. The semiconductor chip according to claim 16, wherein the portion of the surface of the second conductive layer exposed from the bump electrode includes a surface of the outer edge portion of the second conductive layer that faces the surface of the insulating film via a gap therebetween.

18. The semiconductor chip according to claim 1, wherein at least one portion of the curved portion is located in the upper portion of the side face of the post bump.

* * * * *